United States Patent
Priddy et al.

(10) Patent No.: US 9,062,369 B2
(45) Date of Patent: Jun. 23, 2015

(54) DEPOSITION OF HIGH VAPOR PRESSURE MATERIALS

(75) Inventors: Scott Wayne Priddy, Saint Louis Park, MN (US); Chad Michael Conroy, Stillwater, MN (US)

(73) Assignee: Veeco Instruments, Inc., Plainview, NY (US)

( * ) Notice: Subject to any disclaimer, the term of this patent is extended or adjusted under 35 U.S.C. 154(b) by 613 days.

(21) Appl. No.: 12/730,800

(22) Filed: Mar. 24, 2010

(65) Prior Publication Data

US 2010/0248416 A1 Sep. 30, 2010

Related U.S. Application Data

(60) Provisional application No. 61/163,302, filed on Mar. 25, 2009.

(51) Int. Cl.
  *C23C 16/00* (2006.01)
  *C23C 14/24* (2006.01)
  *C23C 14/06* (2006.01)

(52) U.S. Cl.
  CPC ........... *C23C 14/243* (2013.01); *C23C 14/0623* (2013.01); *Y02E 10/52* (2013.01)

(58) Field of Classification Search
  CPC .................................................. C23C 14/243
  USPC ................................ 118/726, 727
  See application file for complete search history.

(56) References Cited

U.S. PATENT DOCUMENTS

| 2,707,098 | A | * | 4/1955 | Turpin .......................... 261/157 |
| 4,356,429 | A |   | 10/1982 | Tang |
| 4,539,507 | A |   | 9/1985 | VanSlyke et al. |
| 4,662,981 | A | * | 5/1987 | Fujiyasu et al. ................. 117/93 |
| 4,720,432 | A |   | 1/1988 | VanSlyke et al. |
| 4,769,292 | A |   | 9/1988 | Tang et al. |
| 5,550,066 | A |   | 8/1996 | Tang et al. |
| 5,804,054 | A |   | 9/1998 | Bhattacharya et al. |
| 5,820,681 | A |   | 10/1998 | Colombo et al. |
| 5,827,371 | A |   | 10/1998 | Colombo et al. |
| 5,932,294 | A |   | 8/1999 | Colombo et al. |
| 5,968,601 | A |   | 10/1999 | Leon et al. |
| 6,030,458 | A |   | 2/2000 | Colombo et al. |
| 6,048,442 | A |   | 4/2000 | Kushiya et al. |

(Continued)

FOREIGN PATENT DOCUMENTS

| JP | 3-111575 | 5/1991 |
| JP | 5-332974 | 12/1993 |

(Continued)

OTHER PUBLICATIONS

Priddy, U.S. Appl. No. 12/539,458, filed Aug. 11, 2009.

(Continued)

*Primary Examiner* — Keath Chen
(74) *Attorney, Agent, or Firm* — Kagan Binder, PLLC

(57) ABSTRACT

The present invention provides deposition sources, systems, and related methods that can efficiently and controllably provide vaporized material for deposition of thin-film materials. The deposition sources, systems and related methods described herein can be used to deposit any desired material and are particularly useful for depositing high vapor pressure materials such as selenium in the manufacture of copper indium gallium diselenide based photovoltaic devices.

16 Claims, 19 Drawing Sheets

(56) References Cited

U.S. PATENT DOCUMENTS

| | | |
|---|---|---|
| 6,237,529 B1 | 5/2001 | Spahn |
| 6,245,150 B1 | 6/2001 | Lyons et al. |
| 6,258,166 B1 | 7/2001 | Leon et al. |
| 6,337,102 B1 | 1/2002 | Forrest et al. |
| 6,395,344 B1 | 5/2002 | Baret et al. |
| 6,514,342 B2 | 2/2003 | Kozarek et al. |
| 6,562,405 B2 | 5/2003 | Eser et al. |
| 6,696,096 B2 | 2/2004 | Tsubaki et al. |
| 6,749,906 B2 | 6/2004 | Van Slyke |
| 6,821,347 B2 | 11/2004 | Carpenter et al. |
| 6,830,626 B1 | 12/2004 | Smith |
| 6,837,939 B1 | 1/2005 | Klug et al. |
| 6,893,939 B1 | 5/2005 | Grace et al. |
| 6,982,005 B2 | 1/2006 | Eser et al. |
| 7,026,258 B2 | 4/2006 | Taunier et al. |
| 7,067,170 B2 | 6/2006 | Marcus et al. |
| 7,070,658 B2 | 7/2006 | Guido et al. |
| 7,259,322 B2 | 8/2007 | Gronet |
| 7,306,823 B2 | 12/2007 | Sager et al. |
| 7,319,190 B2 | 1/2008 | Tuttle |
| 2002/0155230 A1 | 10/2002 | Forrest et al. |
| 2003/0168013 A1 | 9/2003 | Freeman et al. |
| 2004/0144321 A1 | 7/2004 | Grace et al. |
| 2006/0045958 A1 | 3/2006 | Abiko et al. |
| 2006/0057750 A1 | 3/2006 | Aoki et al. |
| 2006/0062918 A1 | 3/2006 | Long et al. |
| 2007/0253686 A1* | 11/2007 | Wendt et al. .......... 392/388 |
| 2007/0298159 A1* | 12/2007 | Bender et al. .......... 427/8 |
| 2008/0014825 A1* | 1/2008 | Fukuda et al. .......... 445/46 |
| 2008/0173241 A1 | 7/2008 | Priddy et al. |
| 2008/0194821 A1* | 8/2008 | Johannes et al. .......... 546/2 |

FOREIGN PATENT DOCUMENTS

| | | | |
|---|---|---|---|
| JP | 6-228740 | 8/1994 | |
| JP | 9-209126 | 8/1997 | |
| JP | 9-228032 | 9/1997 | |
| JP | 9-287070 | 11/1997 | |
| JP | 2000-208033 | 7/2000 | |
| JP | 2007-146219 | 6/2007 | |
| JP | 2008-019477 | * 1/2008 | .......... C23C 14/24 |
| JP | 8-024998 | 2/2008 | |
| JP | 2008-169456 | 7/2008 | |

OTHER PUBLICATIONS

Priddy et al., U.S. Appl. No. 12/539,443, filed Aug. 11, 2009.

* cited by examiner

DEPOSITION OF HIGH VAPOR PRESSURE MATERIALS

CROSS REFERENCE TO RELATED APPLICATIONS

This application claims the benefit of U.S. Provisional Application Ser. No. 61/163,302 filed Mar. 25, 2009 entitled DEPOSITION SOURCES, SYSTEMS, AND RELATED METHODS FOR DEPOSITING HIGH VAPOR PRESSURE MATERIALS which is completely incorporated by reference herein for all purposes.

TECHNICAL FIELD

The deposition sources, systems, and methods described herein relate generally to deposition sources, systems, and methods for providing a flux of material vapor for deposition on a substrate. The deposition sources, systems, and methods described herein are particularly useful for deposition of high vapor pressure materials such as selenium, for example.

BACKGROUND

Semiconductor materials that include compounds of copper indium diselenide (CIS) with gallium substituted for all or part of the indium, commonly referred to as copper indium gallium diselenide (CIGS), are used in many photovoltaic devices. Importantly, CIGS semiconductor materials have a direct band gap that permits strong absorption of solar radiation in the visible range. CIGS semiconductor materials are therefore often used as absorber layers in thin-film solar cells. As a result, CIGS solar cells have demonstrated high efficiencies and good stability as compared to other common absorber layer compounds such as cadmium telluride (CdTe) and amorphous silicon (a-Si).

Solar cell devices typically include one or more of a substrate, barrier layer, back contact layer, semiconductor layer, buffer layer, intrinsic transparent oxide layer, and conducting transparent oxide layer. In a solar cell device the CIGS materials used for photovoltaic conversion need to have a p-type semiconductor character and appropriate charge transport properties. The charge transport properties of the CIGS materials are related to the crystallinity of the material. It is therefore important that the CIGS material is at least partially crystallized in order to have sufficient charge transport properties for use in solar cells.

CIGS thin-films can be deposited by various techniques, which are typically vacuum based. One technique involves the use of precursors. In this technique, intermediate compounds are used and have physicochemical properties that are distinct from those of CIGS and make them incapable of photovoltaic conversion. The precursors are initially deposited in a thin-film form, and this thin-film is subsequently processed to form the intended CIGS layer. When precursor materials are deposited at a low temperature, the resulting CIGS thin-films are weakly crystallized or amorphous. These thin-films need to be annealed by supplying heat to improve the crystallization of the CIGS and provide satisfactory charge transport properties. At the temperatures that allow at least partial crystallization of the CIGS, however, one of the constituent elements of the CIGS, namely the selenium, is more volatile than the other elements. It is therefore difficult to obtain crystallized CIGS with the intended composition and stoichiometry without adding selenium during annealing of the precursor layer. In the fabrication of CIGS thin-films for photovoltaic applications, therefore, time consuming annealing of the precursor deposits in the presence of a selenium excess in the vapor phase is needed.

Another technique for depositing CIGS thin-films involves vacuum evaporation. Devices formed by this technique often have high photovoltaic conversion efficiencies compared to techniques that use precursor materials. Typically, co-evaporation of the copper, indium, gallium, and selenium is performed in the presence of a substrate. This co-evaporation technique has an advantage in that the content of gallium in the thin-film light-absorbing layer can be regulated to optimize the bandgap. Evaporation is a technique that can be difficult to use on the industrial scale. In particular, it is challenging to provide uniform thin-films over large surface areas, such as those used for fabrication of solar cells. Efficient use of the primary materials is also challenging. Selenium is particularly difficult to use efficiently because of its high vapor pressure.

SUMMARY

Deposition sources, systems, and methods described herein can efficiently and controllably provide vaporized material for deposition of thin-film materials. The deposition sources, systems, and methods described herein can be used to deposit any desired material and are particularly useful for depositing high vapor pressure materials such as selenium. One exemplary application where efficient and controllable deposition of selenium is desirable is in the formation of photovoltaic cells such as for use in solar cells, for example. In the fabrication of such solar cells, selenium is co-evaporated with copper, indium, and gallium to form a functional absorbing layer of the device.

In an exemplary aspect of the present invention, a vacuum deposition apparatus is provided. The vacuum deposition apparatus includes a vacuum deposition source comprising a body having a crucible for holding deposition material and a nozzle positionable within a vacuum deposition chamber for directing vaporized source material to a substrate within the vacuum deposition chamber. The nozzle comprises a conductance tube in fluid communication with the crucible. The conductance tube comprising one or more nozzle openings through which vaporized deposition material can pass. A jacket surrounds at least a portion of the conductance tube. The jacket provides an enclosure within which the at least a portion of the conductance tube is positioned. At least one heater element is positioned within the jacket.

In another exemplary aspect of the present invention, a nozzle for a vacuum deposition source is provided. The nozzle is positionable within a vacuum deposition chamber for directing vaporized source material to a substrate within the vacuum deposition chamber. The nozzle comprises a conductance tube that can be connected in fluid communication with a source of deposition material. The conductance tube comprises one or more nozzle openings through which vaporized deposition material can pass. A jacket surrounds at least a portion of the conductance tube. The jacket provides a vacuum tight enclosure within which the at least a portion of the conductance tube is positioned. At least one heater element is positioned within the jacket.

In yet another exemplary aspect of the present invention, a method for providing high vapor pressure material to a vacuum chamber is provided. The method comprises providing a source of vaporized deposition material within a conductance tube; enclosing at least a portion of the conductance tube within a jacket; positioning the jacket and conductance tube within a vacuum chamber; maintaining the region within the jacket and outside of the conductance tube at or near atmospheric pressure; heating the at least a portion of the conductance tube with a heating element positioned within the jacket and outside of the conductance tube; and emitting vaporized deposition material from the at least a portion of the conductance tube.

BRIEF DESCRIPTION OF THE DRAWINGS

The accompanying drawings, which are incorporated in and constitute a part of this disclosure, illustrate several aspects of the present invention and together with description of the exemplary embodiments serve to explain the principles of the present invention. A brief description of the drawings is as follows.

DETAILED DESCRIPTION

The exemplary embodiments of the present invention described herein are not intended to be exhaustive or to limit the present invention to the precise forms disclosed in the following detailed description. Rather the exemplary embodiments described herein are chosen and described so those skilled in the art can appreciate and understand the principles and practices of the present invention.

Figure 1:
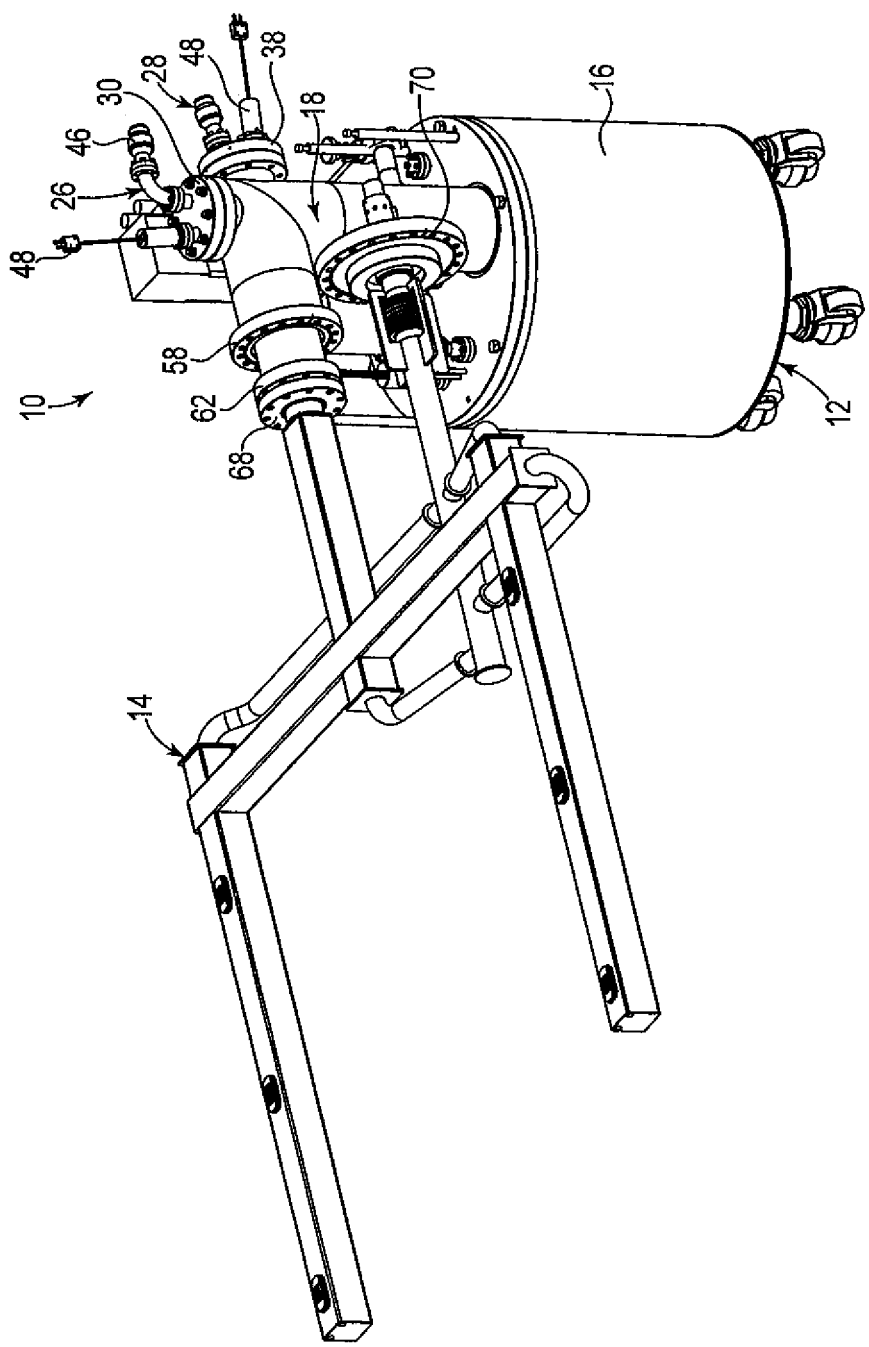
FIG. 1 is a perspective view of an exemplary deposition apparatus in accordance with the present invention. The illustrated deposition apparatus includes an exemplary deposition source and an exemplary nozzle in accordance with the present invention.
Figure 2:
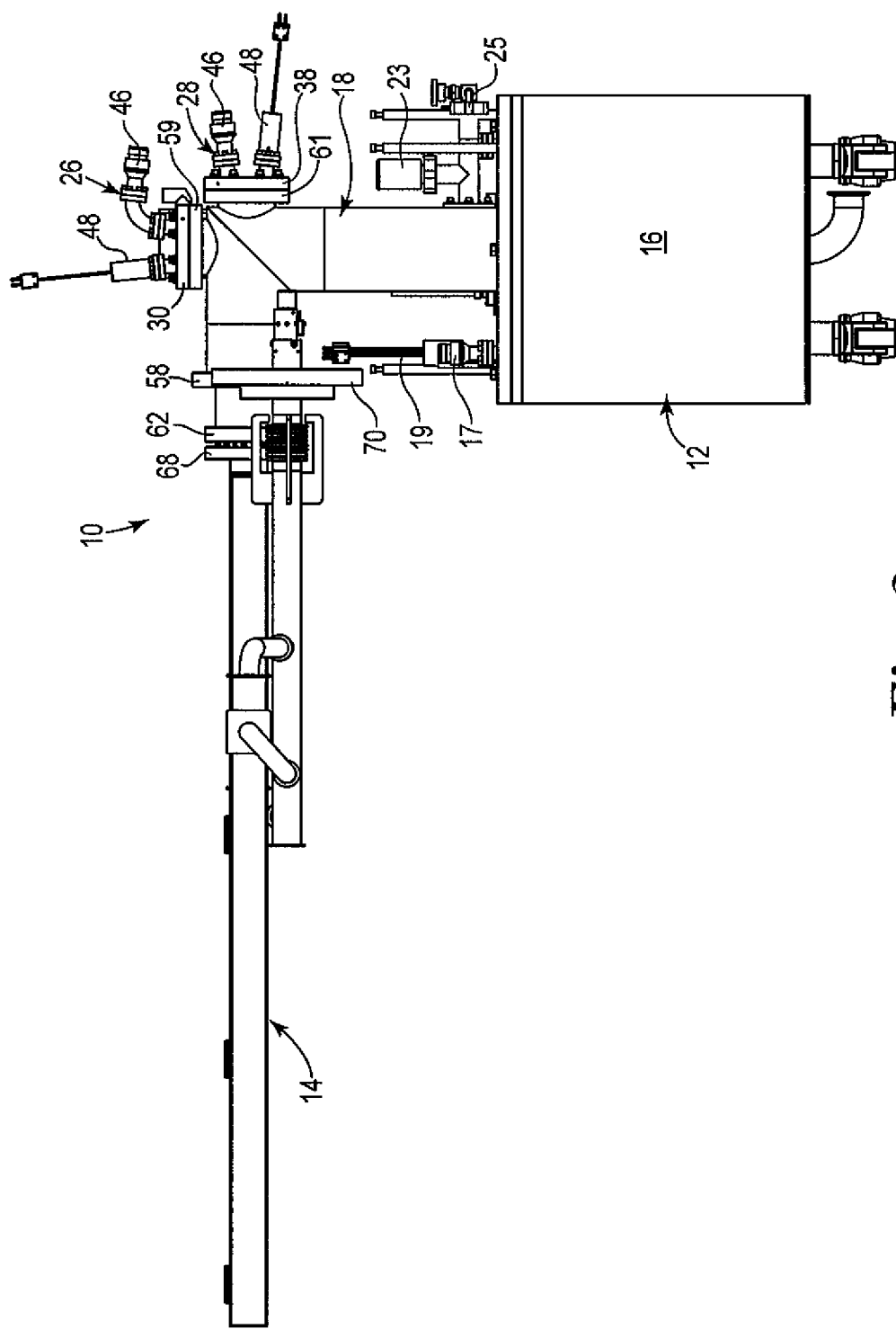
FIG. 2 is a side view of the deposition apparatus shown in FIG. 1.

Exemplary deposition apparatus 10 in accordance with the present invention is illustrated in FIGS. 1-8. Referring initially to FIGS. 1 and 2, deposition apparatus 10 comprises deposition source 12 and nozzle 14. Deposition source 12 is illustrated in more detail in the cross-sectional view of FIG. 3 and generally includes body portion 16 and conductance portion 18. Body portion 16 includes crucible 20 for holding deposition material. As can be seen best in FIG. 3, body portion 16 includes top plate 15. Support legs 22 are attached to top plate 15 and are also attached to crucible 20 so that crucible 20 effectively hangs from top plate 15 via support legs 22. Body portion 16 also includes heater 13 for heating and vaporizing deposition material (not shown) within crucible 20 and for heating valve 24 and the portion of the conductance portion 18 below top plate 15. As shown, heater 13 comprises a generally cylindrical arrangement of resistive filaments. Any desired heater type and geometry can be used.

Additionally, body portion 16 includes power feedthrough 17 for providing power to heater 22 and thermocouple feedthrough 19 for providing a connection to a thermocouple positioned within body portion 16. The design of body portion 16, crucible 20, heater 22, power feedthrough 17, and thermocouple feedthrough 19 can be provided taking into consideration the particular material and associated deposition requirements. That is, the illustrated body portion 16, crucible 20, heater 22, power feedthrough 17, and thermocouple feedthrough 19 are exemplary and can comprise any design suitable for the desired deposition performance.

Figure 3:
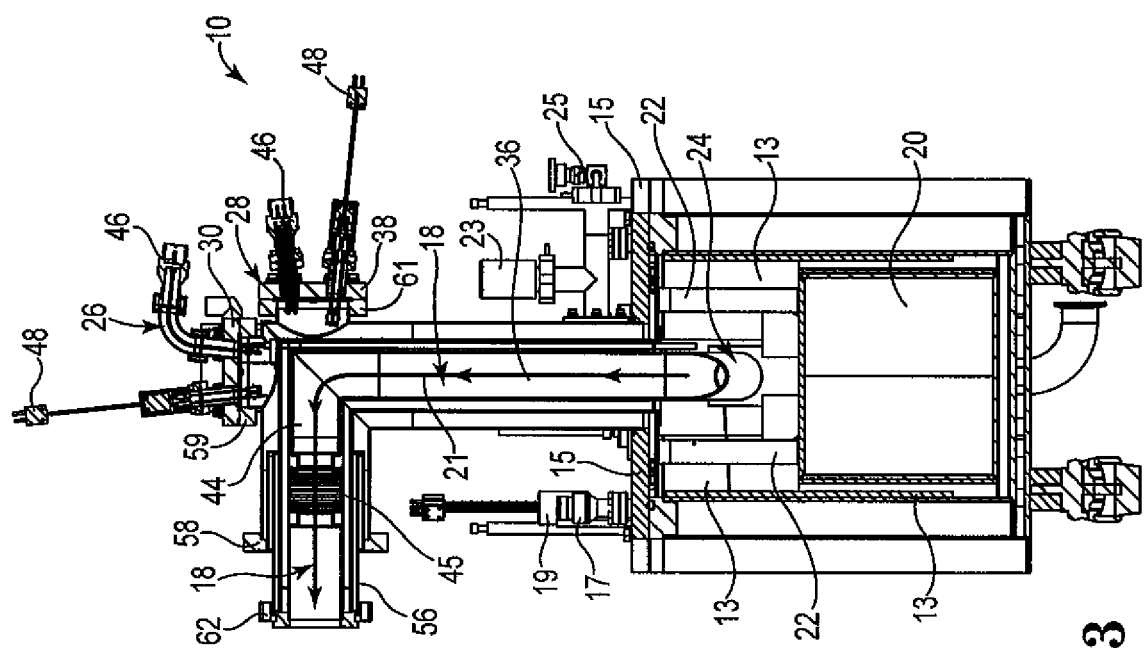
FIG. 3 is a cross-sectional view of the deposition source shown in FIG. 1 and showing in particular a crucible, valve, and conductance portion in accordance with the present invention.

As can be seen with reference to FIGS. 2 and 3, valve 24 is positioned between crucible 20 and conductance portion 18 and functions to regulate the flow of vaporized deposition material exiting crucible 20. Valve 24 may include any valve or device that can control the flow of vaporized deposition material exiting crucible 20. For example, valve 24 may comprise a valve of the type including a body, bellows, valve needle, and valve seat having appropriate corrosion resistance. For use with corrosive deposition materials such as selenium, the valve body may comprise 316 stainless steel. The valve seat and valve needle preferably comprised different materials to avoid sticking or seizure of the valve needle relative to the valve seat. For example, 316 stainless steel can be used together with 316 stainless steel having a coating such as titanium nitride. The valve bellows may comprise any desired material such as 316 stainless steel, titanium nitride coated material, and nickel-molybdenum-chromium alloys or the like. Conductance portion 18 includes vacuum gauge 23 for measuring the vacuum within conductance portion 18 and vent valve 25 that can be used to introduce a desired gas such as when venting deposition source 12, for example. If desired, vacuum gauge 23 can be used to control valve 24 to provide desired deposition parameters and may include use of a control system (not shown). In use, material from crucible 20 moves from crucible 20, through valve 24 and conductance portion 18 to nozzle 14 generally along a path identified with reference numeral 21. Nozzle 14 directs vaporized material to one or more substrate positioned in a vacuum deposition chamber (not shown).

Conductance portion 18 of deposition source 12 is heated to help prevent deposition material from undesirably accumulating on inside surfaces 27 of conductance portion 18. Preferably, conductance portion 18 of deposition source 12 is designed so that the wall temperature of conductance portion 18 can be maintained at a temperature sufficient to avoid condensation of vaporized deposition material on inside surfaces 27 of conductance portion 18. In use, the wall temperature of conductance portion 18 is preferably maintained at a temperature greater than the temperature of the source material in crucible 20. For example, in an exemplary application where the source material is at a temperature of about 325-350° C. the wall temperature of conductance portion 18 is preferably at least about 350-450° C. A Referring to FIGS. 4 and 5 in particular, exemplary deposition source 12 includes vertical heater assembly 26 and horizontal heater assembly 28. Reference to horizontal and vertical orientations is used for convenience only and is meant to be relative to the orientation of deposition source 12 as shown in FIG. 3. Vertical heater assembly 26 includes flange 30. Support strap 32 is attached to flange 30 and is also attached to insulator block 33. Support strap 32 and insulator block 33 hold and position vertically oriented heater rod 34 relative to vertical portion 36 of conductance portion 18.

Similarly, horizontal heater assembly 28 includes flange 38. Support strap 40 is attached to flange 38 and is also attached to insulator block 41. Support strap 40 and insulator block 41 hold and position horizontally oriented heater rod 42 relative to horizontal portion 44 of conductance portion 18. Each of vertical and horizontal heater assemblies, 26 and 28 respectively, include power feedthrough 46 and thermocouple feedthrough 48.

Figure 4:
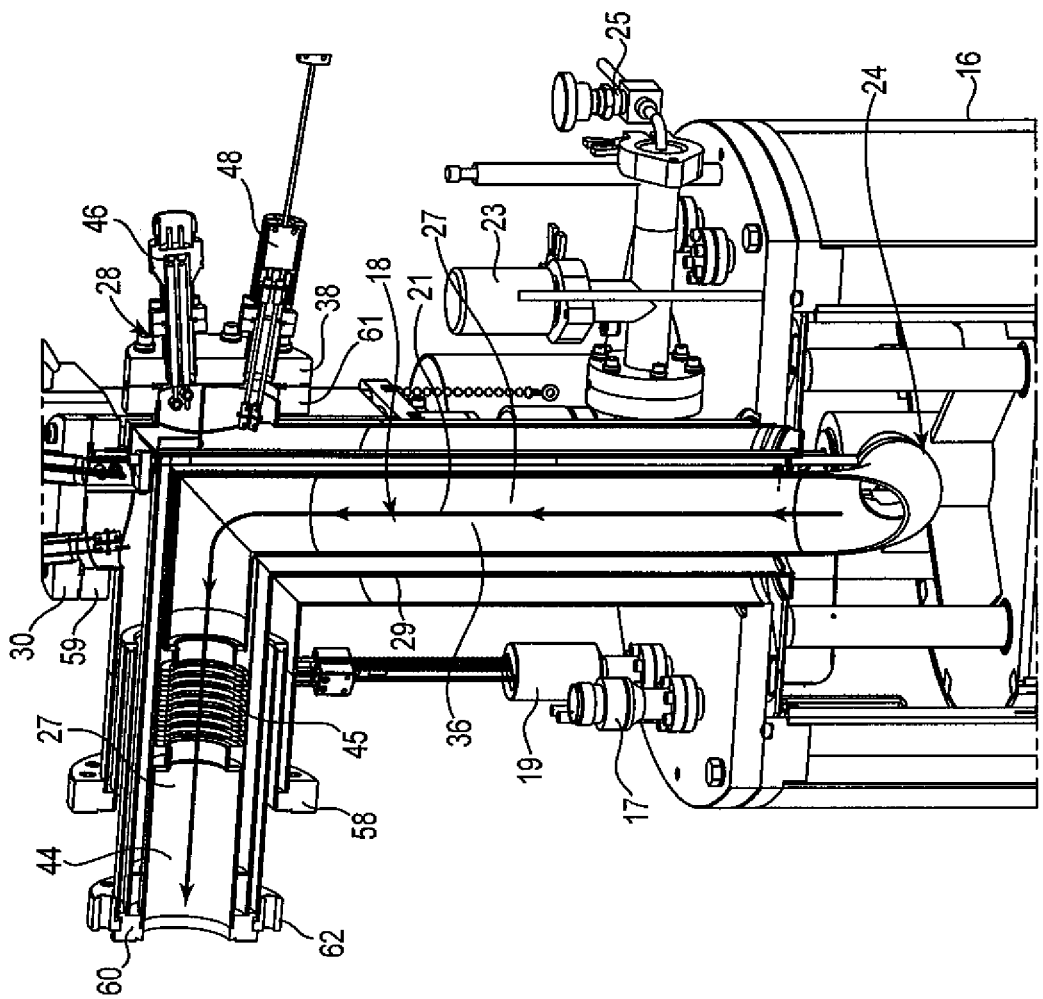
FIG. 4 is a partial cross-sectional perspective view of the deposition source shown in FIG. 3.
Figure 5:
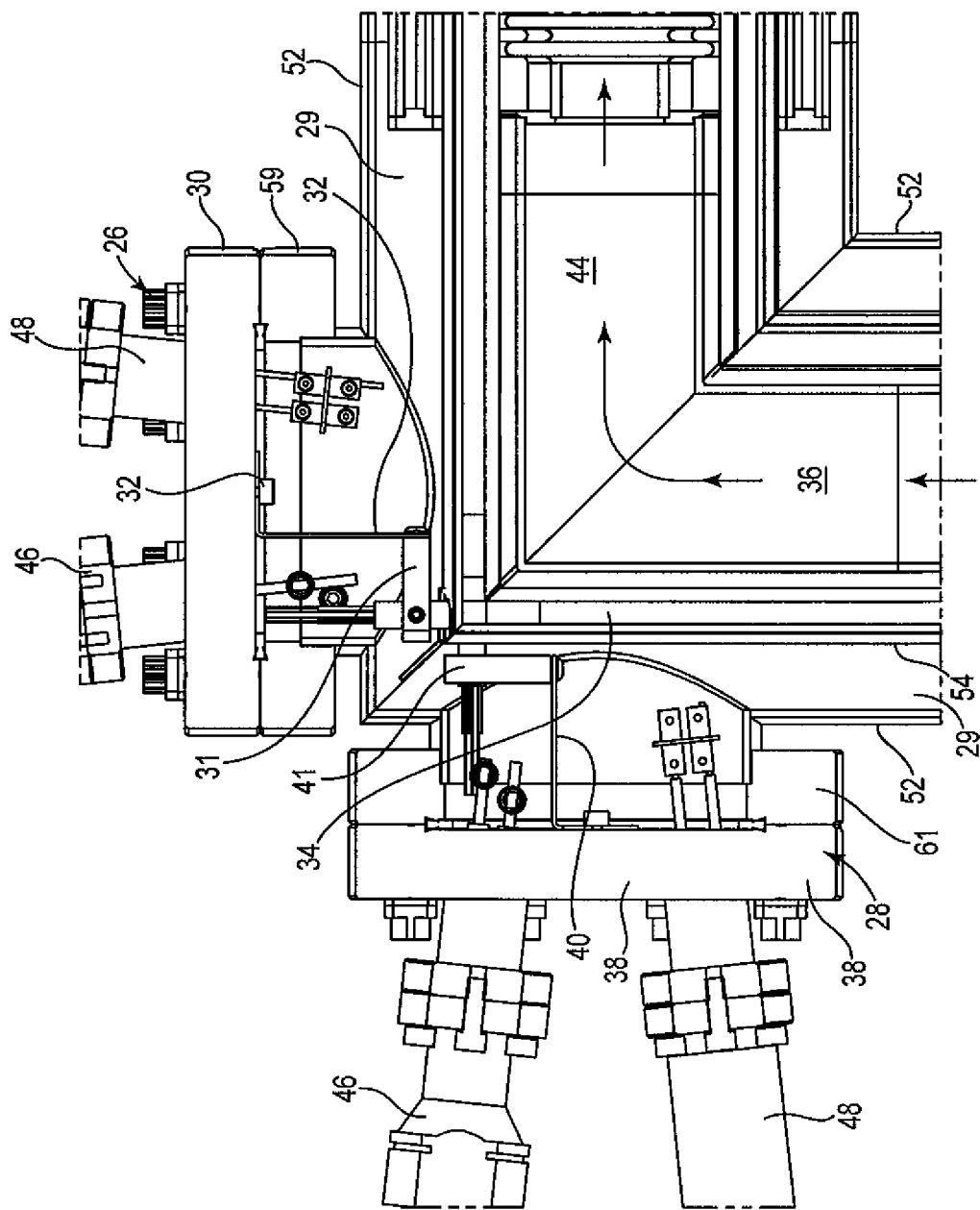
FIG. 5 is a partial cross-sectional perspective view of the deposition source shown in FIG. 3 and showing in particular a vertical heater assembly and a horizontal heater assembly in accordance with the present invention.
Figure 6:
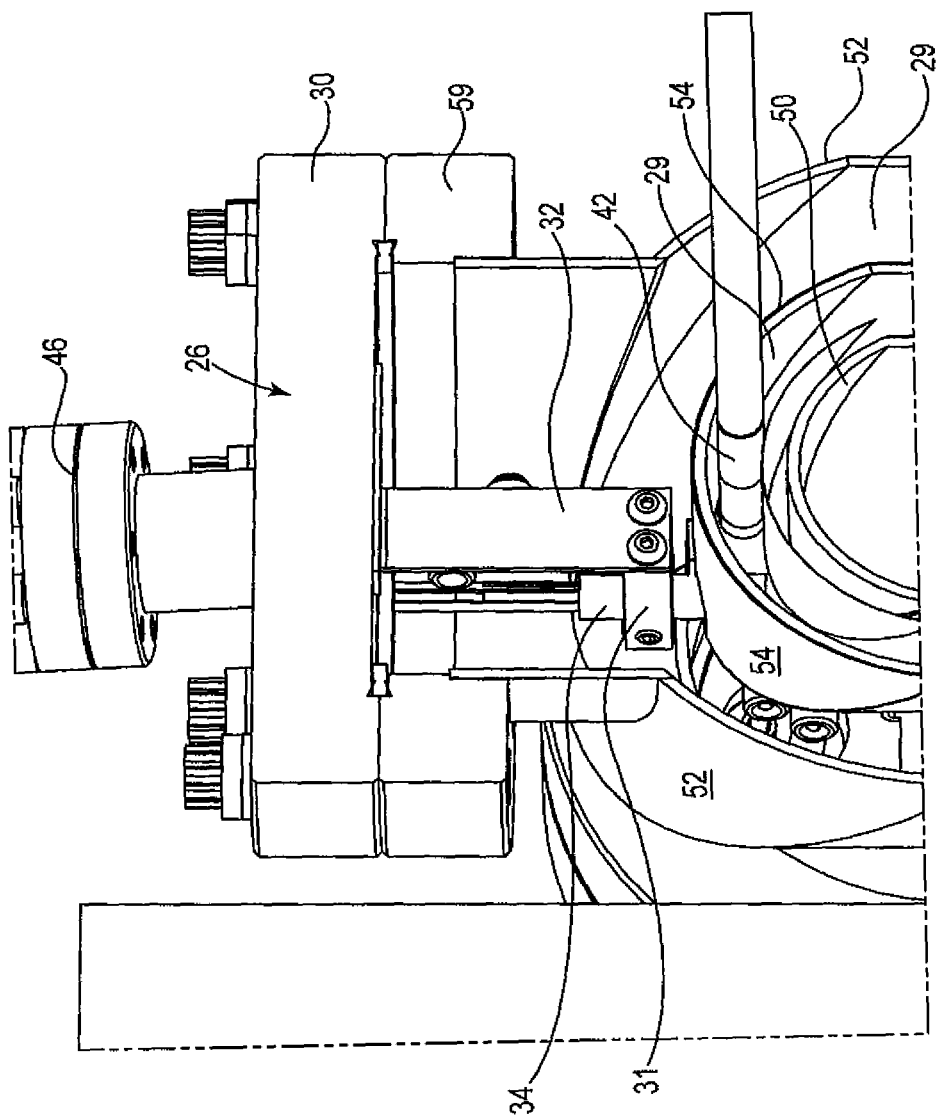
FIG. 6 is a partial cross-sectional perspective view of the deposition source shown in FIG. 3 and showing in particular a conductance tube, heater rod, and jacket in accordance with the present invention.

Now referring to FIG. 6, a cross-sectional view of conductance portion 18 of deposition source 12 as taken through flange 38 of vertical heater assembly 26 is shown. As shown, conductance portion 18 comprises conductance tube 50 and jacket 52 that generally surrounds conductance tube 50. Horizontal heater rod 42, as shown, is positioned outside of horizontal portion 44 of conductance portion 18 and within jacket 52. Also, as shown, heat shielding 54 is preferably positioned between heater rod 42 and jacket 52 thereby helping to create a heated region surrounding conductance tube 50. Vertical heater rod 34 is similarly positioned between vertical portion 36 of conductance portion 18 and jacket 52 as can be seen in FIGS. 3 and 4, for example. This design advantageously keeps heater rod 34 and associated power and thermocouple connections out of the conductance region of vaporized deposition material, which can be undesirably hot and corrosive.

Heater rods 34 and 42 may comprise any desired heating device such as those that include resistive heating elements. Exemplary heating devices that can be used are available from Watlow and comprise tube heaters such as those that provide about 5-15 Watts per inch power. Any number and configuration of heater rods can be used. That is, it is not necessary to use linear rods, as illustrated, and any desired configuration for heater rods 34 and 42 can be used. For example, heating elements that wrap around conductance tube 50 can be used such as heating elements that comprise helixes, serpentine portions, rings, bars, strips, and the like. The combination of different types of heater rods can be used.

Figure 7:
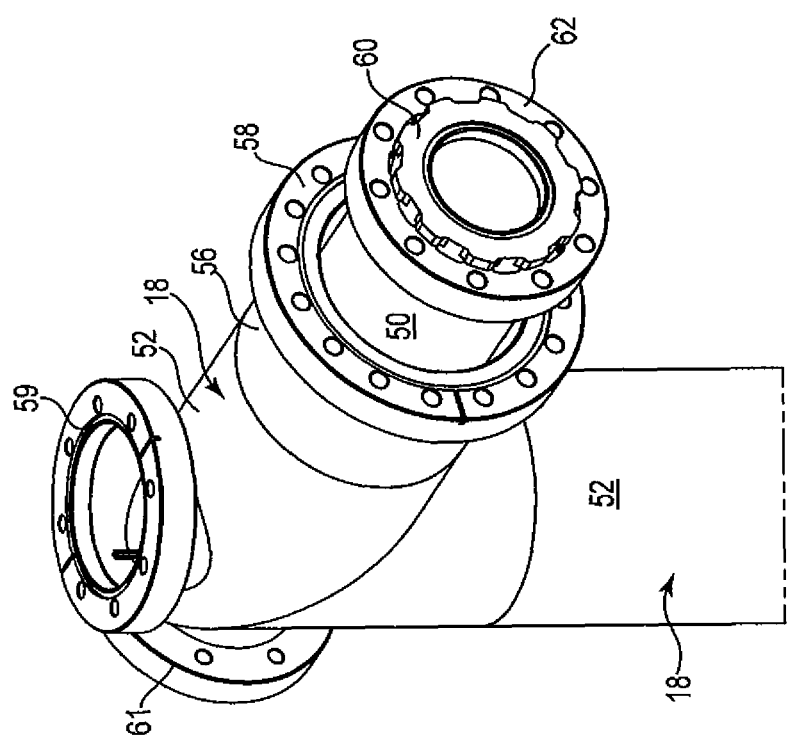
FIG. 7 is a perspective view the conductance portion of the deposition source shown in FIG. 3.
Figure 8:
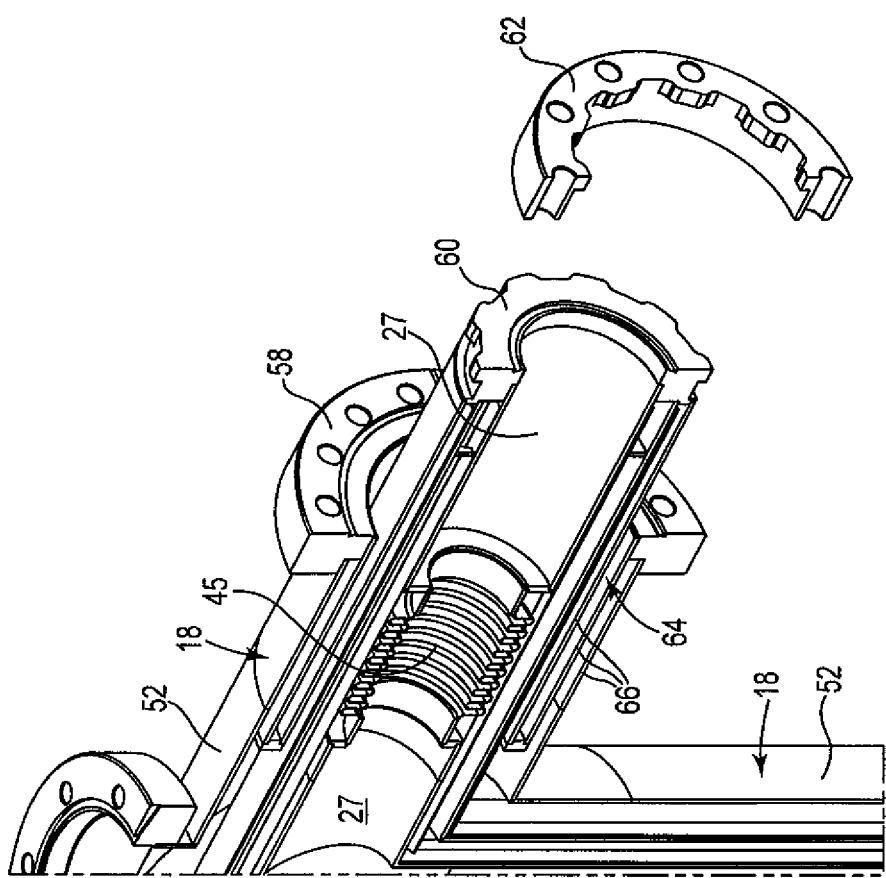
FIG. 8 is a cross-sectional view of the conductance portion shown in FIG. 7 and showing in particular a conductance tube, jacket, and thermal break in accordance with the present invention.

Referring now to FIGS. 7 and 8, end 56 of conductance portion 18 of deposition source 12 is shown in greater detail. End 56 of conductance portion 18 includes system flange 58 for attaching deposition source 12 to a vacuum chamber of a vacuum deposition system (not shown), mounting flange 59 for heater assembly 26, and flange 61 for heater assembly 28. End 56 of conductance portion 18 also includes nozzle flange 60 and bolting ring assembly 62 that function to connect conductance tube 50 of conductance portion 18 to nozzle 14.

Mounting flanges used with the present invention and described herein may comprise any desired appropriate vacuum sealing features. The connection between mounting flanges is designed to be suitably vacuum tight and resealable for the particular application in which deposition apparatus is being used. For example, Conflat® style seals can be used wherein the seal comprises flanges having knife-edges that embed into a soft metal seal gasket such as those made from copper or the like.

Referring to FIG. 7 in particular, connection between system flange 58 and nozzle flange 60 comprises thermal break 64. Thermal break 64 preferably functions to minimize heat transfer between conductance portion 18 and system flange 58 thereby helping to maintain conduction portion 18 at a temperature that prevents condensation of deposition material on inside surface is 27 of conductance portion 18. Thermal break 64, as shown, is designed to have a long path for thermal conduction between system flange 58 and nozzle flange 60. As shown, wall sections 66 are used to provide a long path for thermal conduction between system flange 58 and nozzle flange 60. Horizontal portion 44 of conductance portion 18 also includes optional bellows 45 that functions to minimize stresses created by the thermal expansion and contractions. It is contemplated that any suitable technique can be used to provide the desired thermal management noted above including use of low thermal conductivity materials as well as active cooling such as by use of air or cooling fluid.

Preferably, thermal break 64 is designed to allow conductance from vacuum chamber side of system flange 58 to region 29 defined by jacket 52 and the outside wall of conductance portion 18. In a preferred embodiment, thermal break 64 include openings or vents (not visible in the Figures) that provide such conductance. Preferably, the vacuum level in region 29 is not capable of allowing significant convective thermal transfer. That is, vertical oriented heater rod 34 and horizontally oriented heater rod 42 preferably provide heat by radiative transfer. Any desired vacuum level in region 29 can be used depending on the particular deposition material and desired deposition parameters.

Deposition sources of the present invention are preferably designed so the temperature increases along the path that a corrosive vaporized deposition material follows through a deposition source. For example, in an exemplary embodiment for deposition of selenium, conductance portion 18 is preferably about 20-50° hotter than crucible 20 (for selenium, crucible 20 is preferably at about 325-350° C.), conductance tubes 72 of nozzle 14 are preferably about 20-50° hotter than conductance portion 18, and the regions near nozzle inserts 74 are preferably about 20-50° hotter than conductance tubes 72. Such temperature gradient is preferably designed to minimize or eliminate condensation of deposition material and may be determined empirically. Additionally, while increased temperatures are desired to minimize condensation, it is also desirable to minimize corrosion by maintaining lower temperatures.

Figure 9:
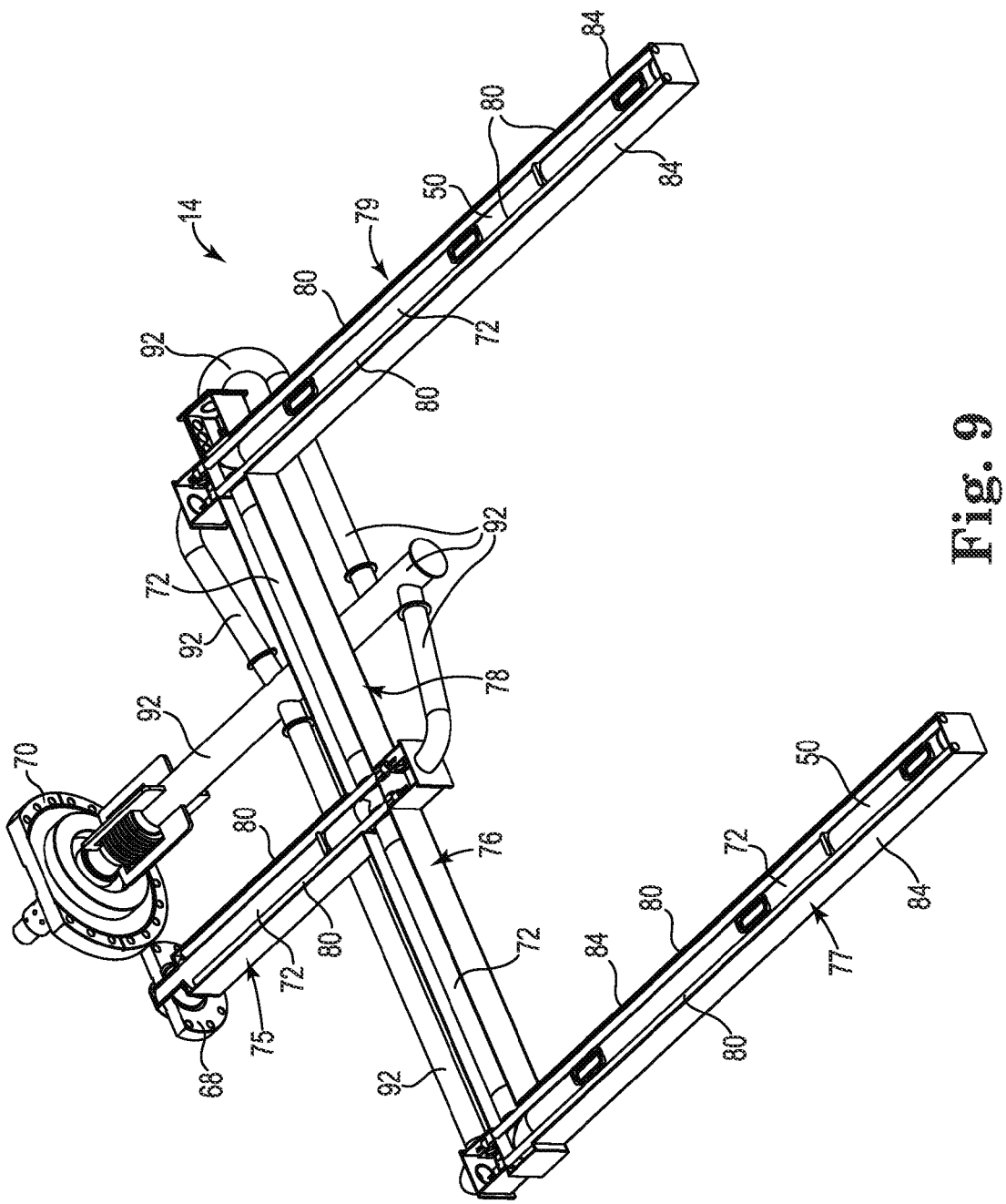
FIG. 9 is a perspective view in partial cross-section of the nozzle of the deposition apparatus shown in FIG. 1.
Figure 10:
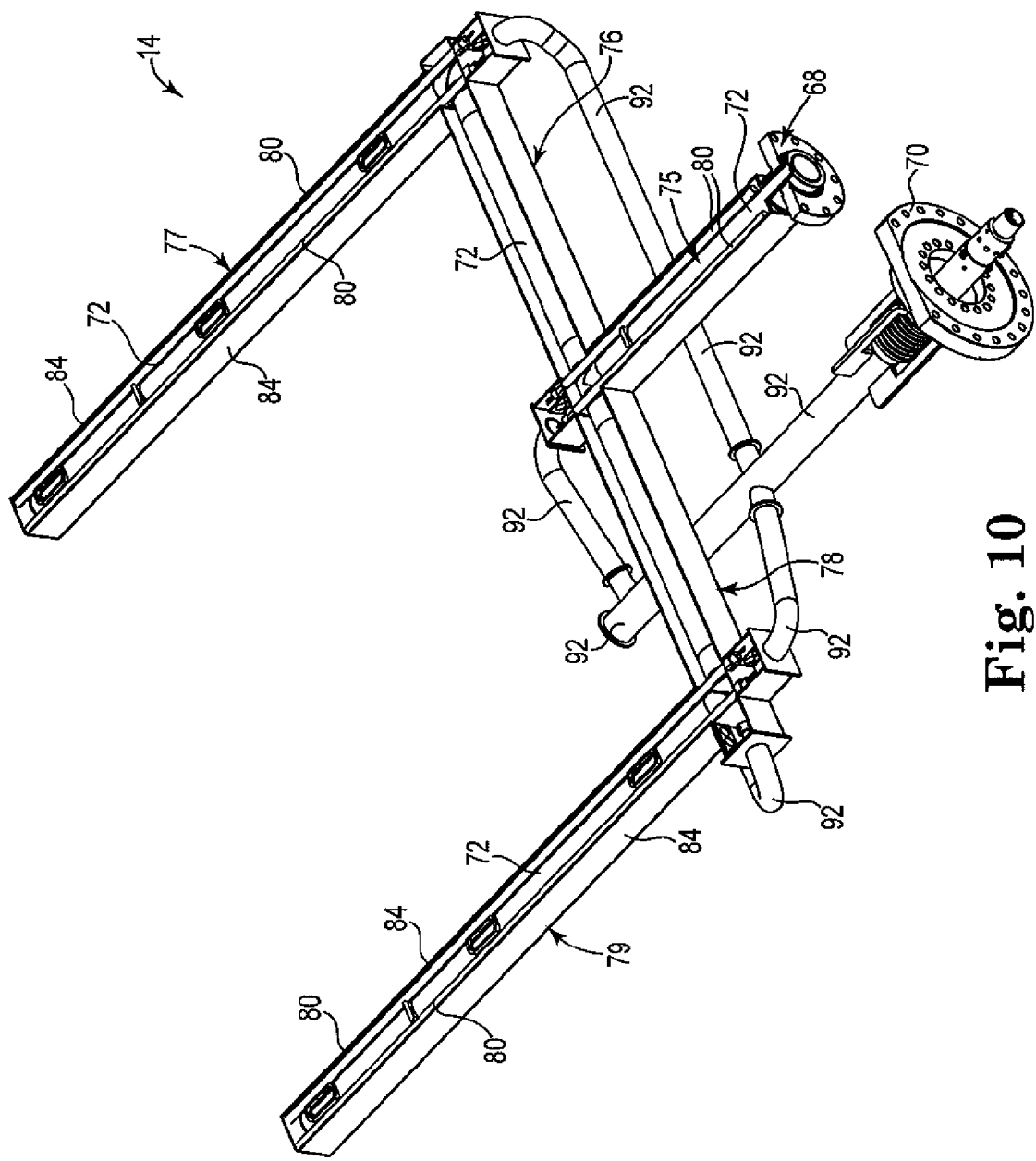
FIG. 10 is another perspective view in partial cross-section of the nozzle shown in FIG. 9.
Figure 11:
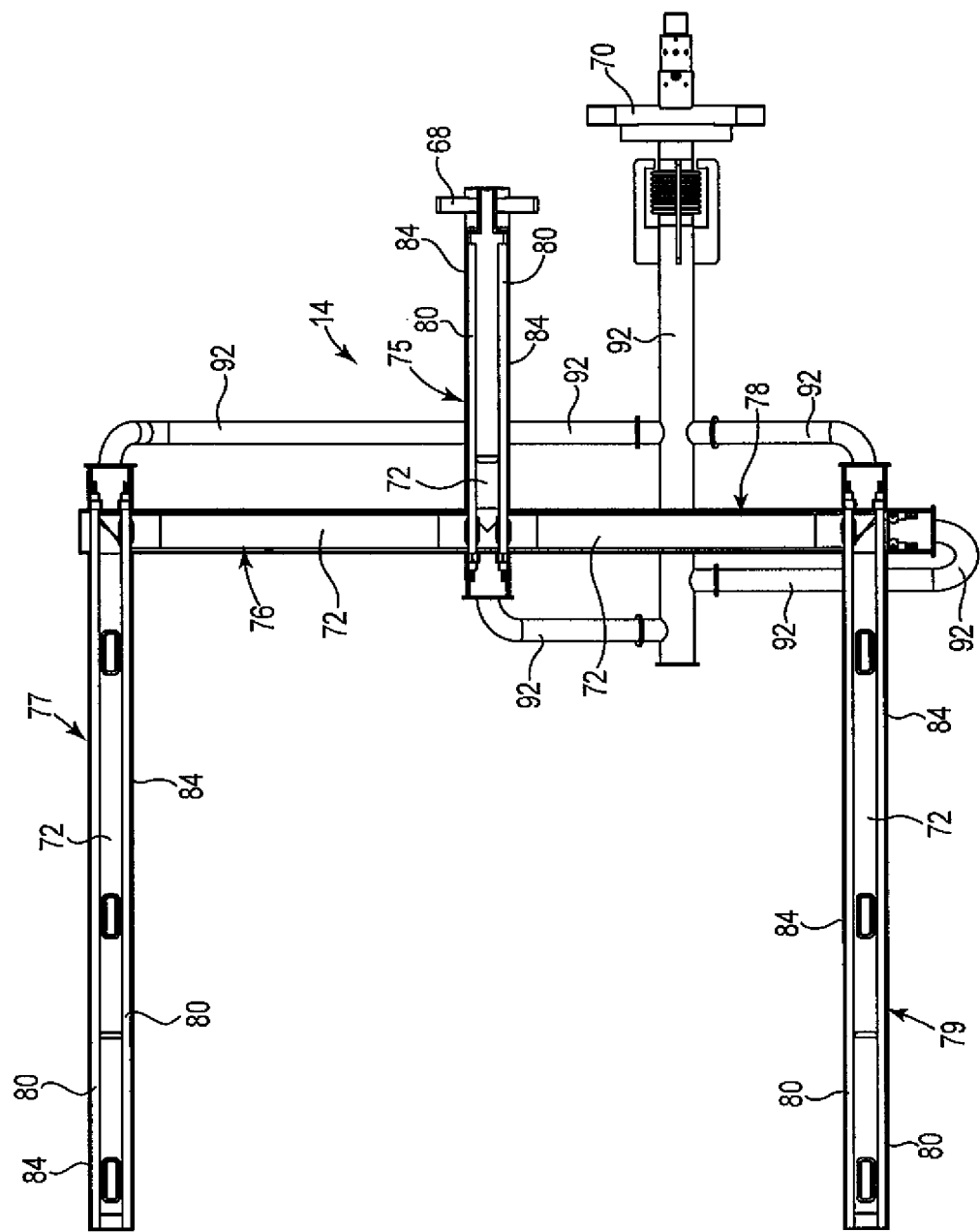
FIG. 11 is a top view of the nozzle shown in FIG. 9.

Deposition sources of the present invention preferably comprise stainless steel construction such as 304 stainless steel as is conventionally used in vacuum deposition equipment. Any suitable materials can be used however; as such material choice depends on factors such as the particular deposition material(s) being used and the desired operating temperatures. For example, crucible 20 may comprise 316 stainless steel and may comprise an optional corrosion resistant coating such as titanium nitride, for example. Preferably, any components that are in contact with a corrosive deposition material such as selenium comprise 316 stainless steel and may comprise an optional corrosion resistant coating such as titanium nitride, for example Referring now to FIGS. 9-19 nozzle 14 of deposition apparatus 10 shown in FIG. 1 is illustrated in greater detail. Referring to FIG. 9 initially, nozzle 14 includes flange 68 for connecting nozzle 14 to conductance portion 18 of deposition source 12. Nozzle 14 also includes flange 70 that provides electrical connections for power and thermocouples and also functions to maintain a desired environment within electrical conduit tubes 92 and in a region that contains heater rods 80.

Generally, nozzle 14 includes interconnected jacketed nozzle conductance tubes 72 that allow vaporized deposition material to flow from deposition source 12 to nozzle 14 where the vaporized deposition material is emitted by nozzle inserts 74 of nozzle 14. Nozzle 14 comprises main axial section 75 that is connected to deposition source 12 and that branches into lateral section 76 and axial section 77 on one side of main axial section 75 and lateral section 78 and axial section 79 on the opposite side of main axial section 75. Axial sections 77 and 79 each include nozzle inserts 74 spaced apart along each section. The illustrated configuration of nozzle sections and spaced apart configuration of nozzle inserts 74 is exemplary and any desired configuration of nozzle sections having any number or configuration of nozzle inserts can be used. In particular, the configuration of nozzle 14 can be designed by considering parameters such as the deposition material, the substrate or arrangement of substrates, the deposition area, the desired rate of deposition, the uniformity of deposited films, and the geometry of the deposition system, for example.

Nozzle 14 is preferably designed so conductance tubes 72 can be heated to minimize undesirable condensation of deposition material within conductance tubes 72. That is, nozzle 14 is designed so that the wall temperature of conductance tubes 72 and the associated conductance path can be maintained at a temperature sufficient to prevent condensation of vaporized deposition material. Heater rods 80, as illustrated, comprise resistive heating elements. It is contemplated however, that any type, number, and configuration of heating devices sufficient to minimize undesirable condensation of deposition material within conductance tubes 72 can be used. In particular, it is not necessary to use linear rods arranged as illustrated. Alternate configurations for heater rods 80 can be used. For example, heating elements that wrap around conductance tubes 72 can be used such as heating elements that comprise rings, helixes, and spirals and combinations thereof.

Preferably, heater rods 80 used to provide heat to conductance tubes 72 are positioned in a region that is maintained at a pressure where thermal conduction is possible between conductance tubes 72 and jacket 84. For example, as best seen in FIGS. 16-19, region 82 between conductance tubes 72 and jacket 84 is preferably maintained at or near atmospheric pressure. Also, wires, connectors, and thermocouples associated with heater rods 80 are also positioned in region 82 that is at or near atmospheric pressure. Such environment can be provided by attaching flange 70 to a source suitable for providing and maintaining the desired environment. Preferably this environment is above about 100 milliTorr where convective thermal transfer is possible. Also, the environment may comprise air or any desired gases such as those that enhance convective thermal transfer. Depending on the type of heating devices used it may be desirable for this environment to be oxygen free.

Figure 19:
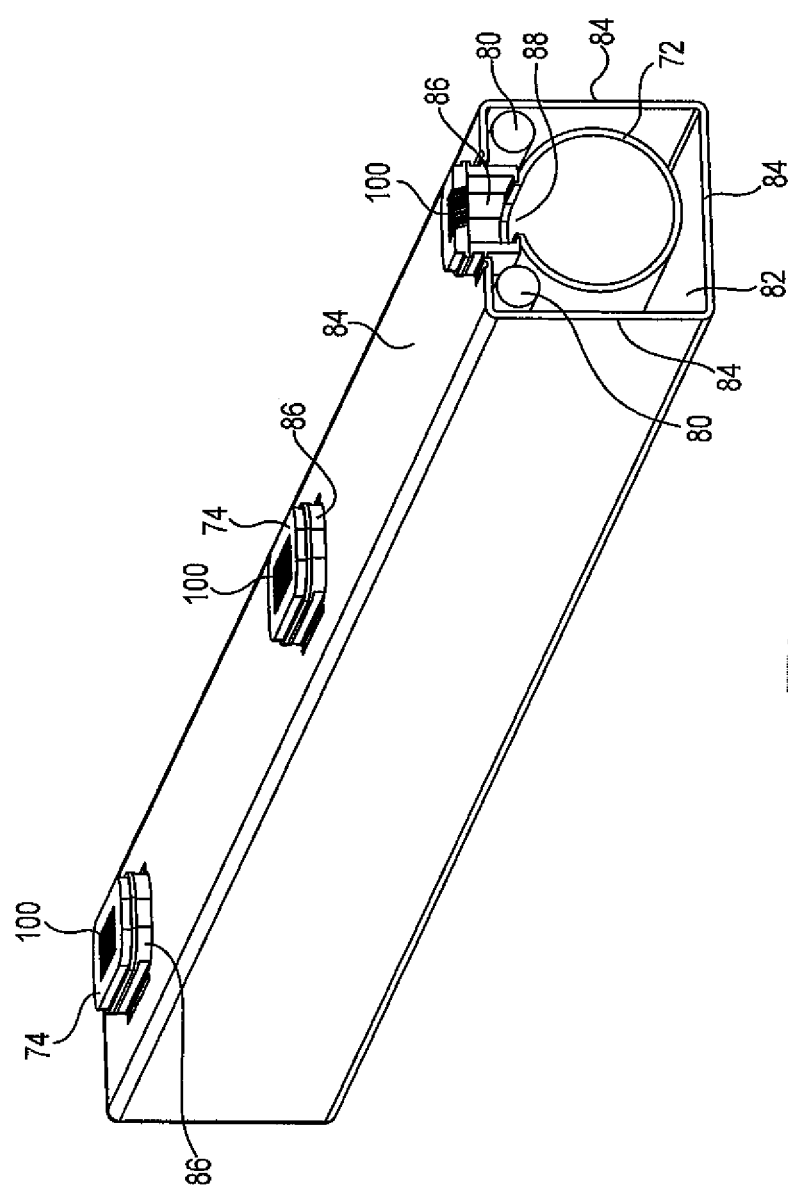
FIG. 19 is a partial cross-sectional perspective view of a portion of the nozzle shown in FIG. 9 and showing in particular a conductance tube, nozzle mount, and nozzle insert in accordance with the present invention.

Referring to FIG. 19 in particular, a cross-section through one of linear sections 77 and 79 and nozzle insert 74 is shown. Conductance tube 72 is positioned within jacket 84 and heater rods 80 are shown positioned within region 82 between conductance tube 72 and jacket 84. Because region 82 is maintained at or near atmospheric pressure, convective heating provides more uniform heated regions around conductance tube 72. As shown, conductance tubes 72 include nozzle mounts 86 that are attached to openings 88 in conductance tubes 72. Nozzle inserts 74 are attached to nozzle mounts 86 and are also attached to jacket 84, as illustrated.

Figure 16:
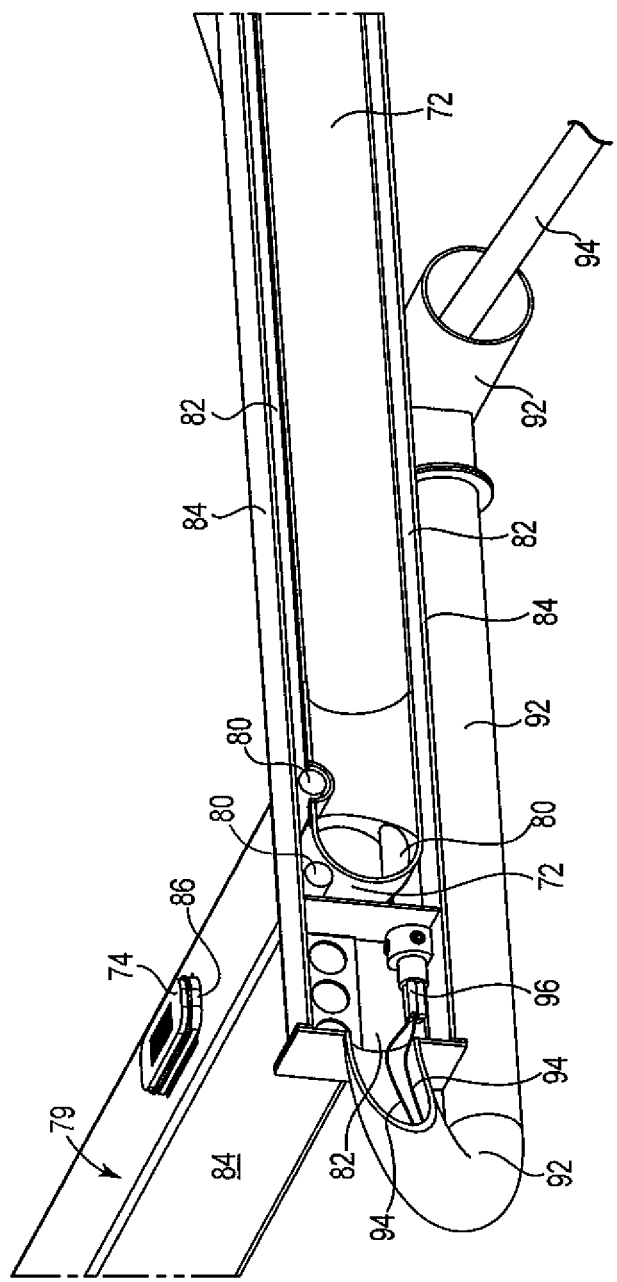
FIG. 16 is a partial cross-sectional perspective view of the nozzle shown in FIG. 9 and showing in particular an electrical conduit and electrical connections to a heater rod in accordance with the present invention.
Figure 17:
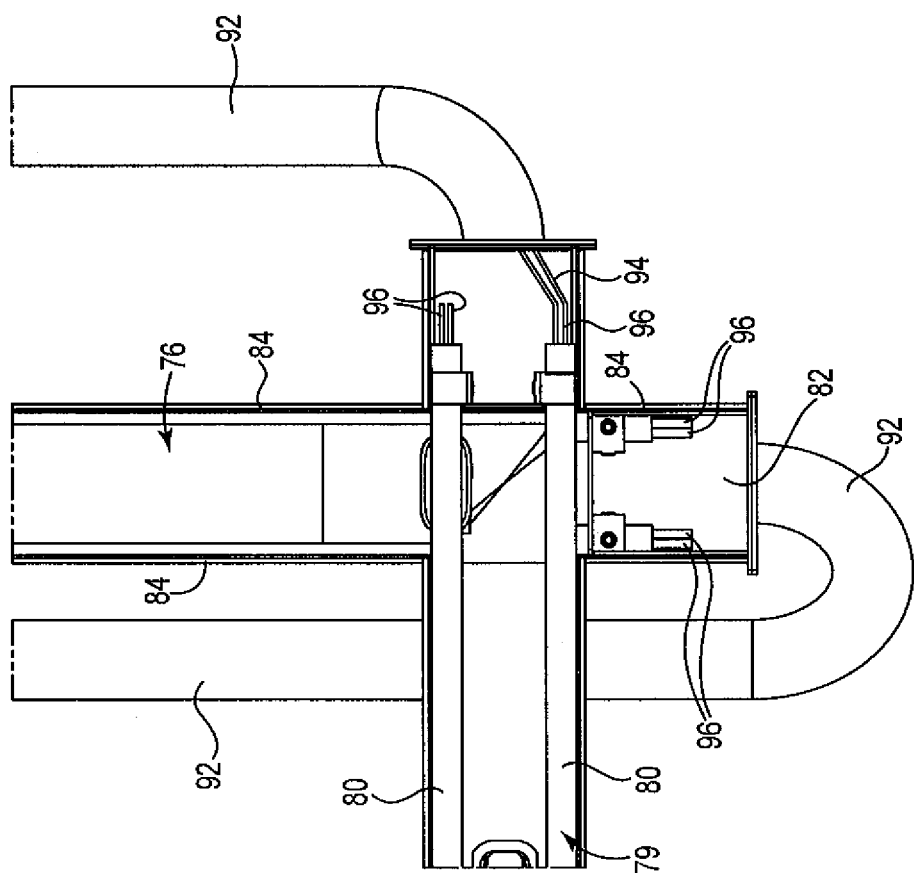
FIG. 17 is a top view in partial cross-section of the nozzle shown in FIG. 9 and showing in particular an exemplary electrical connection to a heater rod in accordance with the present invention.
Figure 18:
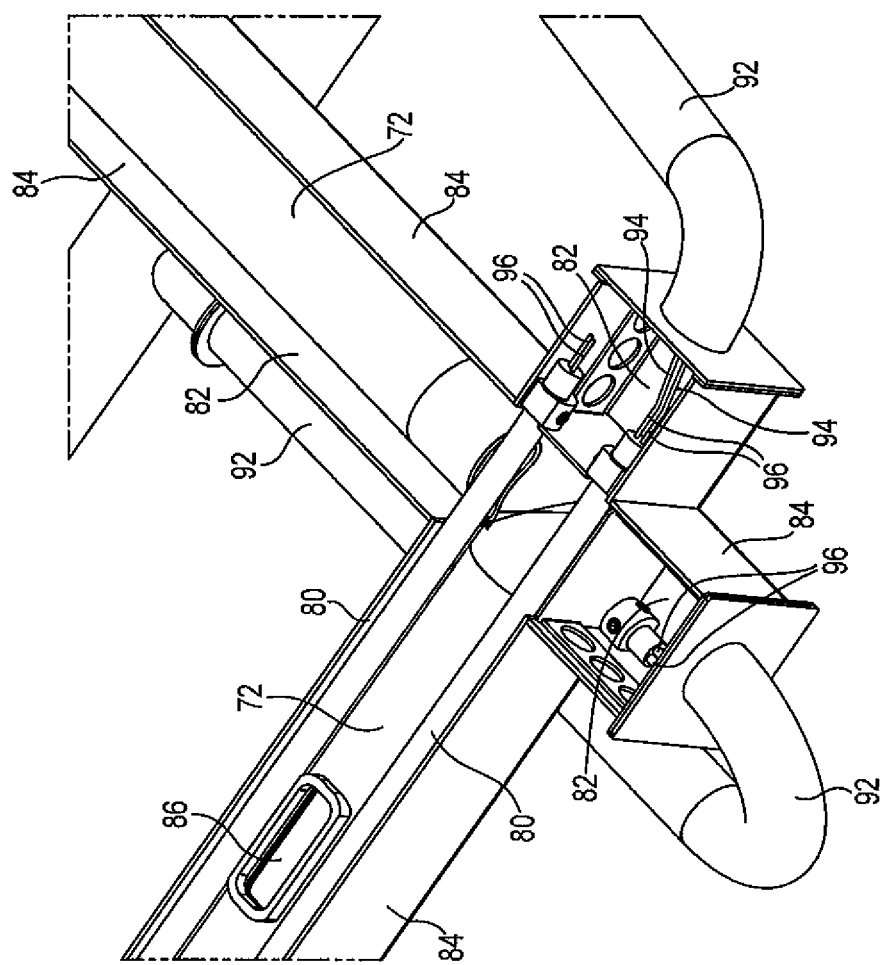
FIG. 18 is a perspective view in partial cross-section of the nozzle shown in FIG. 9 and showing in particular a nozzle mount in accordance with the present invention.

Referring back to FIGS. 9-11 first, nozzle 14 includes an arrangement of electrical conduit tubes 92, as shown. Referring next to FIGS. 16-18, intersection between jacketed conductance tube 72 and an electrical conduit tube 92 is shown. Electrical leads 94 pass through electrical conduit tube 92 and are connected to power leads 96 of heater rods 80. This keeps electrical leads 94 and associated connections out of the corrosive vaporized material environment and away from undesirable heat generated by heater rods 80.

Figure 12:
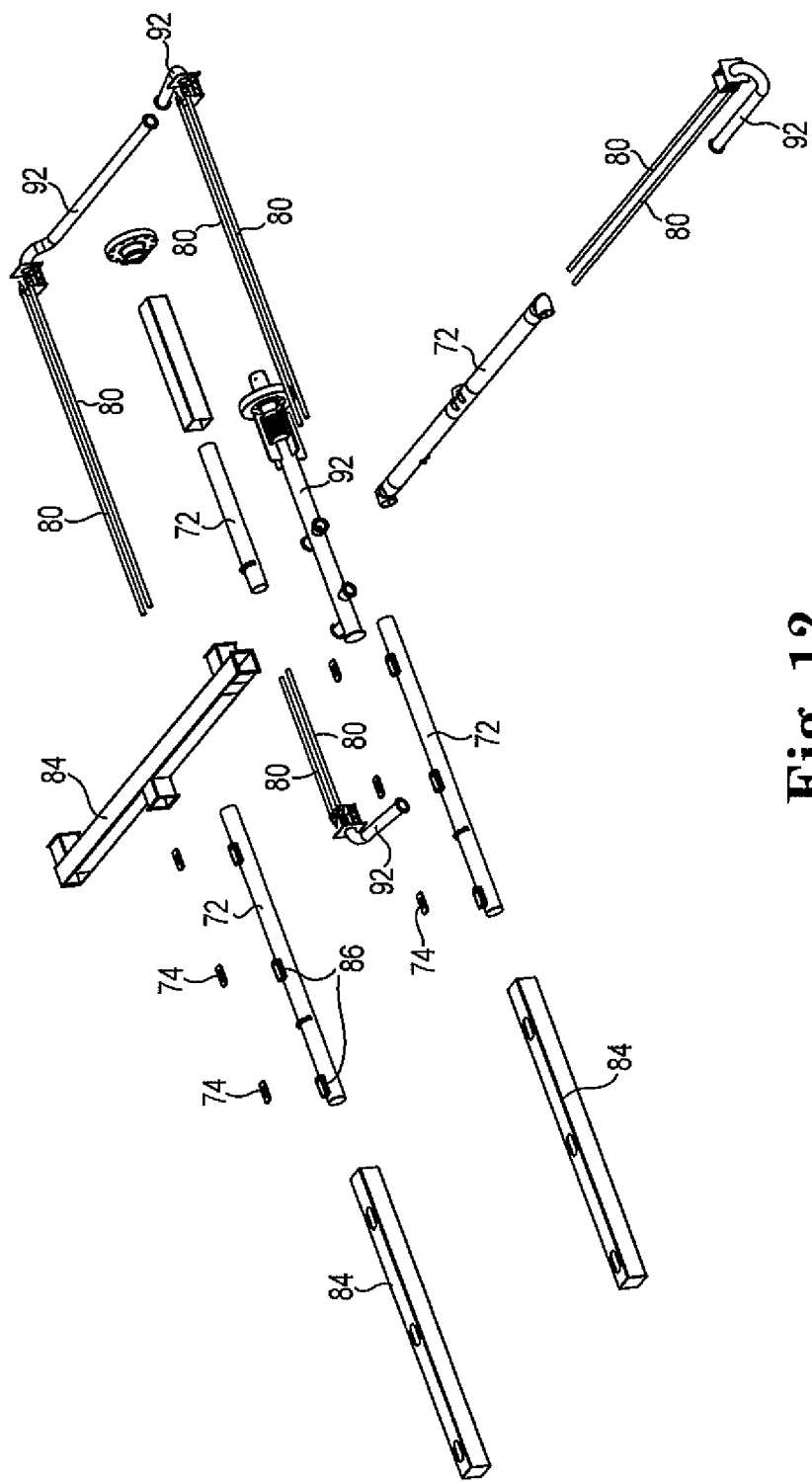
FIG. 12 is an exploded view of the nozzle shown in FIG. 9.
Figure 13:
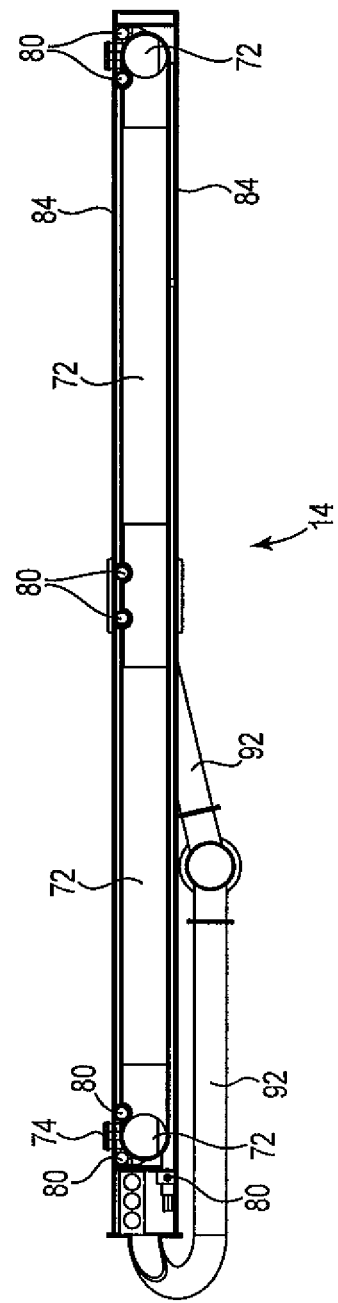
FIG. 13 is a cross-sectional view of the nozzle shown in FIG. 9 and showing in particular conductance tubes and heater rods in accordance with the present invention.
Figure 14:
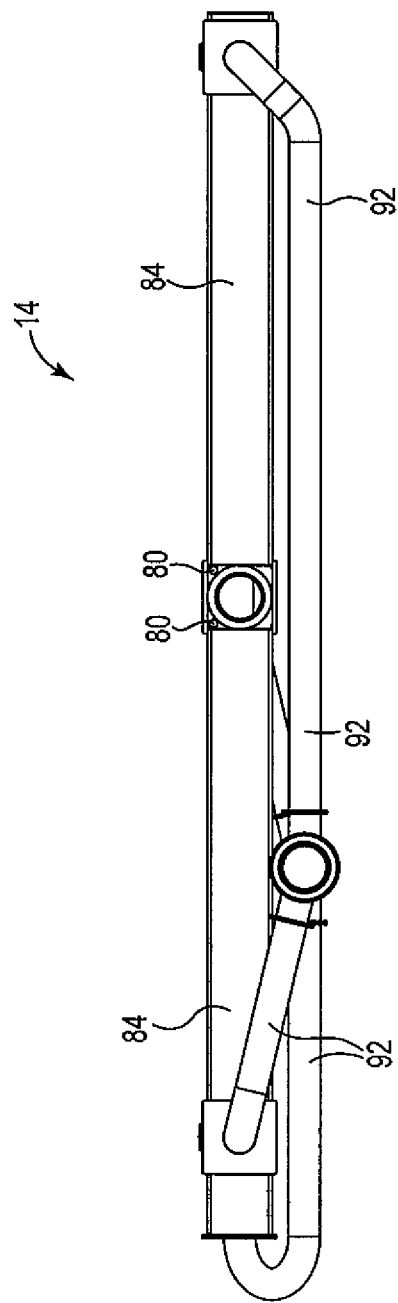
FIG. 14 is another cross-sectional view of the nozzle shown in FIG. 9 and showing in particular conductance tubes and heater rods in accordance with the present invention.
Figure 15:
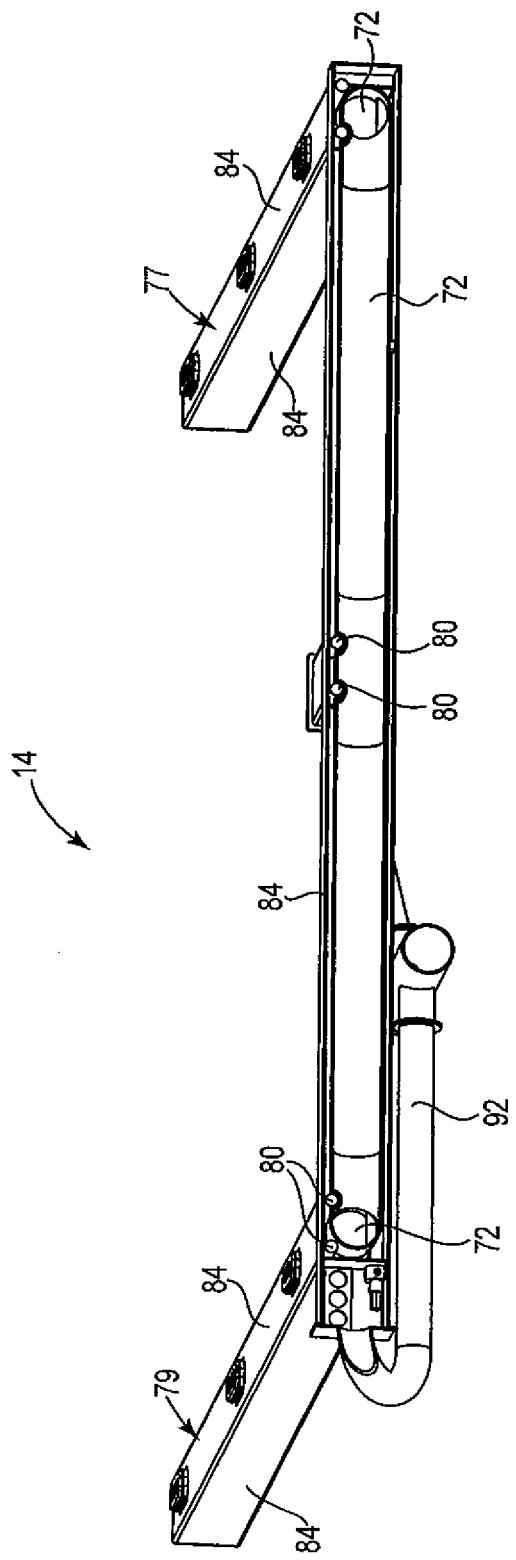
FIG. 15 is another cross-sectional perspective view of the nozzle shown in FIG. 9 and showing in particular conductance tubes and heater rods in accordance with the present invention.

With reference to FIG. 12 in particular, each nozzle opening 88 comprises nozzle insert 74. As shown, nozzle insert 74 comprises body portion 98 having an array of plural directional output jets 100 for directing vaporized deposition material in the direction of one or more substrate positioned relative to nozzle 14. Output jets 100 of each nozzle insert 74 are designed to provide desired deposition performance. For example, the geometry of nozzle jets 100 can be used to provide a deposition material plume having desired characteristics. Nozzle inserts 74 and nozzle jets 100 can have any desired geometry depending on the desired deposition characteristics and the illustrated nozzle inserts 74 are exemplary and not required.

Optionally nozzle inserts 74 may be removable. Using removable nozzle inserts allows for replacement and/or interchangeability of nozzle inserts 74. As illustrated, nozzle inserts 74 are generally identical but are not required to be. That is, nozzle inserts 74 can be distinct from each other such as when designed to tailor the characteristics of the deposition material plume. It is further contemplated that nozzle inserts 74 and nozzle mounts 86 are not required and that desired nozzle features can be integrated with nozzle 14 in any desired manner such as to provide distinct nozzle elements or to provide integrated nozzle features.

Nozzles of the present invention preferably comprise stainless steel construction such as 316 stainless steel. Any suitable materials can be used however; as such material choice depends on factors such as the particular deposition material(s) being used and the desired operating temperatures. Preferably, any components that are in contact with a corrosive deposition material such as selenium comprise 316 stainless steel and may comprise an optional corrosion resistant coating such as titanium nitride, for example Vacuum deposition apparatuses, sources, and nozzles in accordance with the present invention may include any desired fluid cooling arrangement. Such fluid cooling may use any desired cooling fluid such as air, nitrogen, and water, for example.

Vacuum deposition apparatuses, sources, and nozzles in accordance with the present invention may also include heat shielding. Preferably, heat shielding comprises plural layers of refractory metal material. For example, plural layers of tungsten and molybdenum can be used. One or more of layers can be knurled if desired. Heat shielding may be provided as plural segments in order to allow for thermal expansion. Such heat shielding is optional and not required.

Vacuum deposition apparatuses and nozzles in accordance with the present invention can be used with deposition sources used for co-deposition of copper, indium, and gallium. That is, apparatuses in accordance with the present invention can be used to provide selenium deposition material together with deposition sources suitable for providing copper, indium, and gallium. For example, apparatuses and methods for co-deposition of copper, indium, and gallium are described in Applicant's copending patent application Ser. No. 12/628,189 entitled "LINEAR DEPOSITION SOURCE," filed on Nov. 30, 2009, the entire disclosure of which is incorporated by reference herein for all purposes.

As illustrated, nozzle 14 of deposition apparatus 10 is configured to evaporate deposition material in a generally upward direction and nozzle 14 is thus upward-facing wherein upward is meant to be the direction generally opposite to the direction of the gravitational force. It is contemplated that nozzle 14 can be configured to evaporate deposition material in any desired direction including a generally downward direction as well as a generally sideways direction.

The present invention has now been described with reference to several exemplary embodiments thereof. The entire disclosure of any patent or patent application identified herein is hereby incorporated by reference for all purposes. The foregoing disclosure has been provided for clarity of understanding by those skilled in the art of vacuum deposition. No unnecessary limitations should be taken from the foregoing disclosure. It will be apparent to those skilled in the art that changes can be made in the exemplary embodiments described herein without departing from the scope of the present invention. Thus, the scope of the present invention should not be limited to the exemplary structures and methods described herein, but only by the structures and methods described by the language of the claims and the equivalents of those claimed structures and methods.

What is claimed is:

1. A vacuum deposition apparatus comprising a vacuum deposition source comprising a body having a crucible for holding deposition material, the vacuum deposition apparatus also comprising a conductance portion operatively connecting the vacuum deposition source to a nozzle, the conductance portion including a connection element for mounting the vacuum deposition source external to a vacuum deposition chamber while permitting fluid communication from the vacuum deposition source to the nozzle as the nozzle is extended from the connection element to be positionable within the vacuum deposition chamber for directing vaporized source material to a substrate within the vacuum deposition chamber, the nozzle comprising:

a nozzle conductance tube in fluid communication with the crucible by way of the conductance portion, the nozzle conductance tube extending longitudinally and comprising a plurality of axially spaced openings along the longitude of the nozzle conductance tube through which vaporized deposition material can pass;

a jacket surrounding at least a portion of the nozzle conductance tube and extending along the nozzle conductance tube, the jacket providing a pressure controllable region within the jacket and within which the at least a portion of the nozzle conductance tube is positioned, the pressure controllable region having a connection element to connect with a pressure source so that pressure within the pressure controllable region can be independently controlled from an environment of the deposition chamber to create an environment within the pressure controllable region where convective heat transfer is possible between the nozzle conductive tube and the jacket; and at least one heater element positioned within the jacket for providing convective heat transfer with the nozzle conductance tube and the jacket by way of the created environment within the pressure controllable region, wherein the openings along the nozzle conductance tube are operatively connected with nozzle elements that allow fluid communication from within the nozzle conductance tube to outside of the jacket at axial spaced locations to permit fluid communication of vaporized deposition material from the vacuum deposition source to within the vacuum deposition chamber when the nozzle is positioned therein.

2. The deposition apparatus of claim 1, comprising a valve for regulating the flow of vaporized source material from the crucible.

3. The deposition apparatus of claim 1, wherein the nozzle comprises a plurality of spaced apart linear sections that are connected together by a lateral section.

4. The deposition apparatus of claim 3, comprising a plurality of spaced apart nozzle openings and nozzle elements as provided along each linear section.

5. The vacuum deposition apparatus of claim 1 in combination with a vacuum deposition system.

6. The deposition apparatus and deposition system combination of claim 5 wherein the deposition system comprises a photovoltaic device manufacturing system.

7. The deposition apparatus and deposition system combination of claim 5 wherein the nozzle is oriented in an upward-facing configuration relative to the source as determined by a mounting configuration of the connecting element.

8. The deposition apparatus and deposition system combination of claim 5 wherein the nozzle is oriented in a downward-facing configuration relative to the source as determined by a mounting configuration of the connecting element.

9. The deposition apparatus and deposition system combination of claim 5 wherein the vacuum deposition apparatus is configured with selenium within the crucible for depositing selenium.

10. A nozzle for a vacuum deposition source, the nozzle positionable within a vacuum deposition chamber for directing vaporized source material to a substrate within the vacuum deposition chamber, the nozzle comprising:

a nozzle conductance tube that can be connected in fluid communication with a source of deposition material, the nozzle conductance tube extending longitudinally and comprising a plurality of axially spaced nozzle openings along the longitude the nozzle conductance tube through which vaporized deposition material can pass;

a jacket surrounding at least a portion of the nozzle conductance tube and extending along the nozzle conductance tube, the jacket providing a pressure controllable and vacuum tight enclosure within the jacket and within which the at least a portion of the nozzle conductance tube is positioned, the pressure controllable region having a connection element to connect with a pressure source so that pressure within the pressure controllable region can be independently controlled from an environment of the deposition chamber to create an environment within the pressure controllable region where convective heat transfer is possible between the nozzle conductive tube and the jacket; and at least one heater element positioned within the jacket for providing convective heat transfer with the nozzle conductance tube and the jacket by way of the created environment within the pressure controllable region, wherein the openings along the nozzle conductance tube are operatively connected with nozzle elements that allow fluid communication from within the nozzle conductance tube to outside of the jacket at axial spaced locations to permit fluid communication of vaporized deposition material from the source of deposition material to within the vacuum deposition chamber when the nozzle is positioned therein.

11. The nozzle of claim 10 in combination with a vacuum deposition source comprising a crucible for deposition material.

12. The nozzle and source combination of claim 11, comprising a valve for regulating the flow of vaporized source material from the crucible.

13. The nozzle of claim 10, wherein the nozzle comprises a plurality of spaced apart linear sections that are connected together by a lateral section.

14. The nozzle of claim 13, comprising a plurality of spaced apart nozzle openings and nozzle elements as provided along each linear section.

15. The nozzle of claim 10 in combination with a vacuum deposition system.

16. The nozzle and deposition system combination of claim 15 wherein the deposition system comprises a photovoltaic device manufacturing system.

* * * * *